(12) United States Patent
Gopalakrishnan et al.

(10) Patent No.: US 10,523,191 B2
(45) Date of Patent: Dec. 31, 2019

(54) METHOD AND SYSTEM FOR HIGH FREQUENCY SIGNAL SELECTION

(71) Applicant: Maxlinear, Inc., Carlsbad, CA (US)

(72) Inventors: Sangeetha Gopalakrishnan, Carlsbad, CA (US); Wenjian Chen, Carlsbad, CA (US); Vamsi Paidi, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 249 days.

(21) Appl. No.: 15/651,290

(22) Filed: Jul. 17, 2017

(65) Prior Publication Data
US 2018/0019738 A1    Jan. 18, 2018

Related U.S. Application Data

(60) Provisional application No. 62/363,611, filed on Jul. 18, 2016.

(51) Int. Cl.
*H03K 17/00* (2006.01)
*H03B 5/02* (2006.01)
*H03H 11/02* (2006.01)
*H03H 11/34* (2006.01)

(52) U.S. Cl.
CPC ............ *H03K 17/002* (2013.01); *H03B 5/02* (2013.01); *H03H 11/02* (2013.01); *H03H 11/34* (2013.01)

(58) Field of Classification Search
CPC ...... H03K 17/002; H03H 11/34; H03H 11/02; H03B 5/02
See application file for complete search history.

(56) References Cited

U.S. PATENT DOCUMENTS

| | | | |
|---|---|---|---|
| 6,252,461 B1* | 6/2001 | Raab | H03F 1/0205 330/124 R |
| 6,943,624 B2* | 9/2005 | Ohnishi | H03F 1/0277 330/124 D |

* cited by examiner

*Primary Examiner* — Jeffrey M Shin
(74) *Attorney, Agent, or Firm* — McAndrews, Held & Malloy, Ltd.

(57) ABSTRACT

Aspects of methods and systems for high frequency signal selection are provided. The system for high frequency signal selection comprises a first driver and a second driver. The first driver is able to receive a first high frequency input, and the second driver is able to receive a second high frequency input. The output of the first driver is operably coupled, via a first inductive element, to a first resistive load and a first buffer, and the second driver is operably coupled, via a second inductive element, to the output of the first driver. One or both of the first high frequency input and the second high frequency input may be transferred to the first buffer by selectively enabling a current to one or both of the first driver and the second driver, respectively.

36 Claims, 4 Drawing Sheets

METHOD AND SYSTEM FOR HIGH FREQUENCY SIGNAL SELECTION

CROSS-REFERENCE TO RELATED APPLICATIONS

This patent application claims priority to and benefit from of the U.S. Provisional Patent Application No. 62/363,611, filed on Jul. 18, 2016. The above identified application is hereby incorporated herein by reference in its entirety

BACKGROUND

Limitations and disadvantages of conventional methods and systems for high frequency signal selection will become apparent to one of skill in the art, through comparison of such systems with some aspects of the present invention as set forth in the remainder of the present application with reference to the drawings.

BRIEF SUMMARY

Systems and methods are provided for high frequency signal selection, substantially as shown in and/or described in connection with at least one of the figures, as set forth more completely in the claims.

Advantages, aspects and novel features of the present disclosure, as well as details of an illustrated embodiment thereof, will be more fully understood from the following description and drawings.

DETAILED DESCRIPTION

Typically, the use of two or more high speed clocks in an integrated circuit would require interconnect circuitry to be multiplied. Also two or more different high speed clocks may span a large bandwidth. The use of a multiplexer (MUX) suitable for two or more high frequencies over a large bandwidth may provide a simplified local oscillator path design that may save cost and reduce circuit size for many applications.

Figure 1:
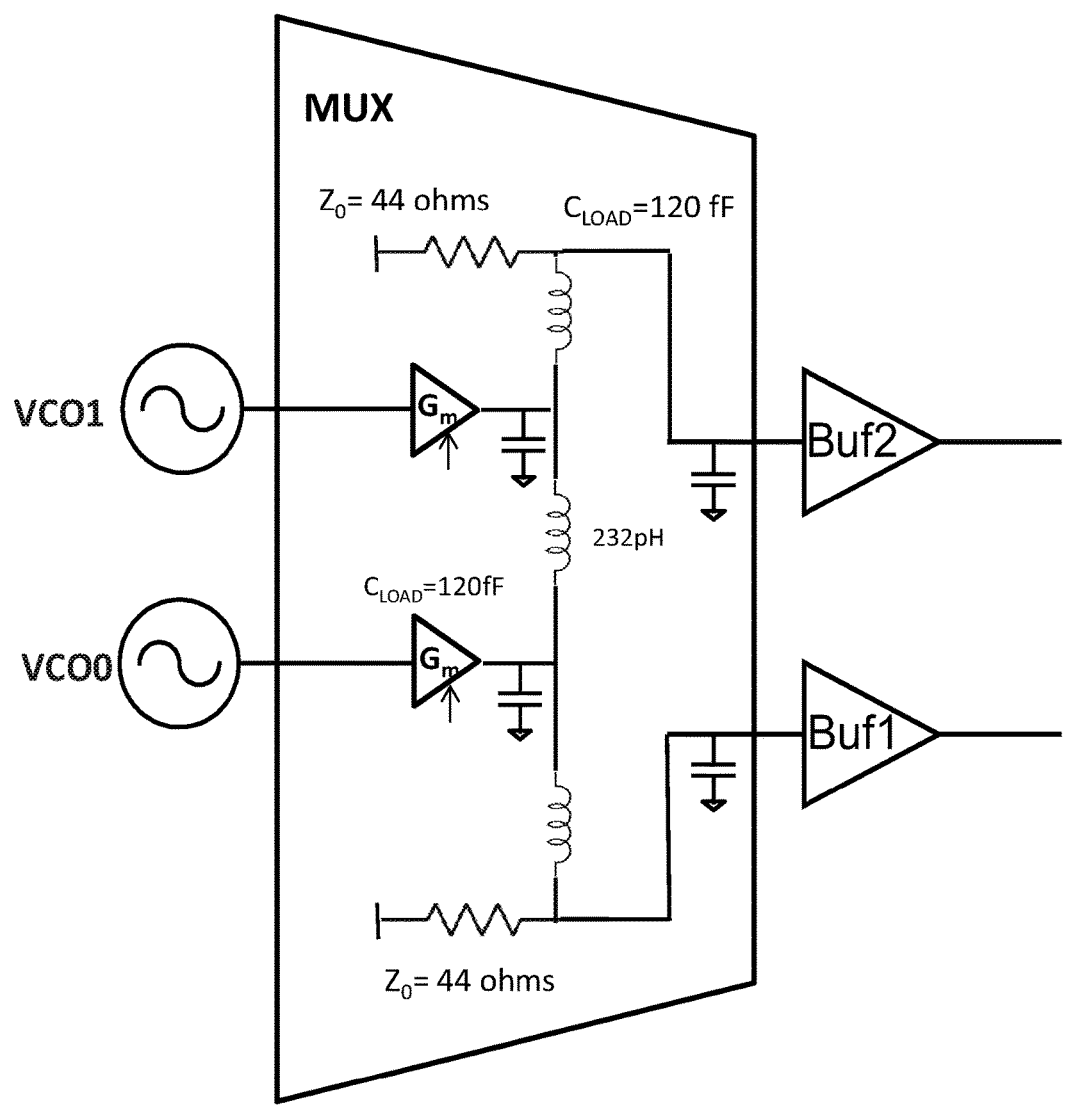
FIG. 1 shows an exemplary oscillator multiplexer with two inputs and two outputs, in accordance with an example embodiment of the disclosure.

FIG. 1 shows an exemplary oscillator multiplexer, in accordance with an example embodiment of the disclosure. This high frequency travelling wave mux includes two inputs and two outputs and covers a very high frequency bandwidth. In FIG. 1, one voltage controlled oscillator (VCO) frequency is selected and can be muxed out to two outputs. FIG. 1 is a system comprising two oscillators, an exemplary oscillator multiplexer, and two buffers. The exemplary oscillator multiplexer in FIG. 1 comprises two drivers, three inductors (or comparable inductive elements), and two resistive loads. Each oscillator is operably coupled to each driver input. Each driver output is operably coupled, via an inductor, to a resistive load and a buffer input. The two driver outputs are operably coupled via another inductor.

The VCO frequency is selected by enabling the current to the corresponding driver. The MUX is implemented using transmission line load which can have very high bandwidth. For example, if the drivers and buffers each contribute a capacitive load of 120 fF and the inductors are 232 pH the resistive load (R) is sqrt(L/C)=sqrt (232 pH/120 fF)=44 ohm. A characteristic impedance of the synthetic transmission line of 44 ohm could damp the resonance frequency (F), which is 1/(2*pi*sqrt(L*C))=30 GHz. Using these example values, the maximum input VCO frequencies may be based on the resonance frequency.

Figure 2:
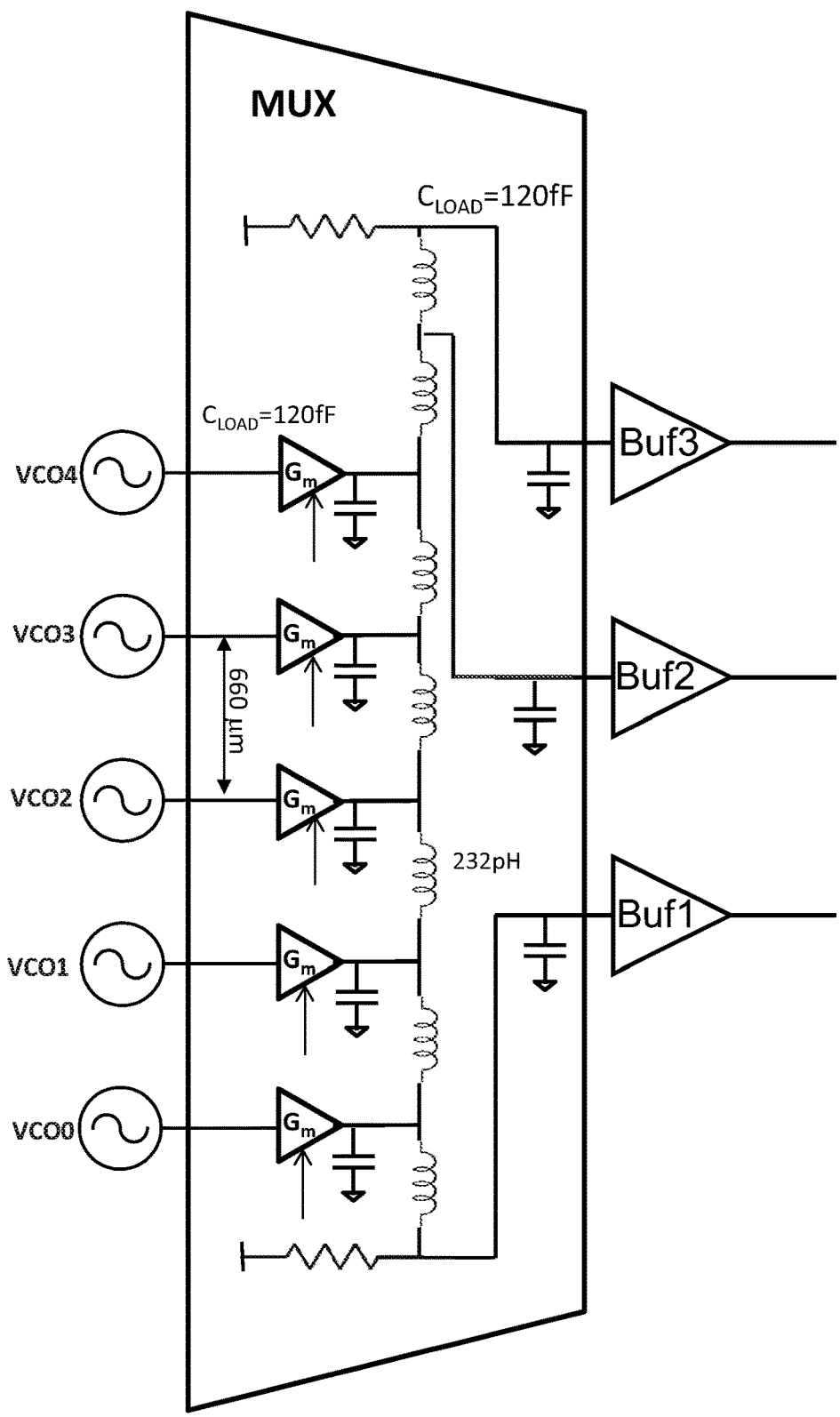
FIG. 2 shows an exemplary oscillator multiplexer with five inputs and three outputs, in accordance with an example embodiment of the disclosure.

FIG. 2 shows another exemplary oscillator multiplexer, in accordance with an example embodiment of the disclosure. This high frequency travelling wave mux includes five inputs and three outputs and covers a very high frequency bandwidth. In FIG. 2, one voltage controlled oscillator (VCO) frequency is selected and can be muxed out to three outputs. FIG. 2 is a system comprising five oscillators, an exemplary oscillator multiplexer, and three buffers. The exemplary oscillator multiplexer in FIG. 2 comprises five drivers, seven inductors, and two resistive loads. Each oscillator is operably coupled to each driver input. The output of a first driver, on the bottom, is operably coupled, via a first inductor, to a first resistive load and a first buffer input. The output of the first driver is also operably coupled, via a second inductor, to the output of a second driver. The output of the second driver is also operably coupled, via a third inductor, to the output of a third driver. The output of the third driver is also operably coupled, via a fourth inductor, to the output of a fourth driver The output of the fourth driver is also operably coupled, via a fifth inductor, to the output of a fifth driver. The output of the fifth driver is also operably coupled, via a sixth inductor, to the input of a second buffer. The input of a second buffer is also operably coupled, via a seventh inductor, to the input of a third buffer and to a second resistive load.

In the multiplexer of FIG. 1, the signal path from VCO1 to Buf1 is longer than the signal path from VCO1 to Buf2. Also, the signal path from VCO1 to Buf1 is longer than the signal path from VCO0 to Buf1. As a result of the path length difference, the phase of VCO1 at Buf1 may be shifted with respect to the phase of VCO0 at Buf1.

Figure 3:
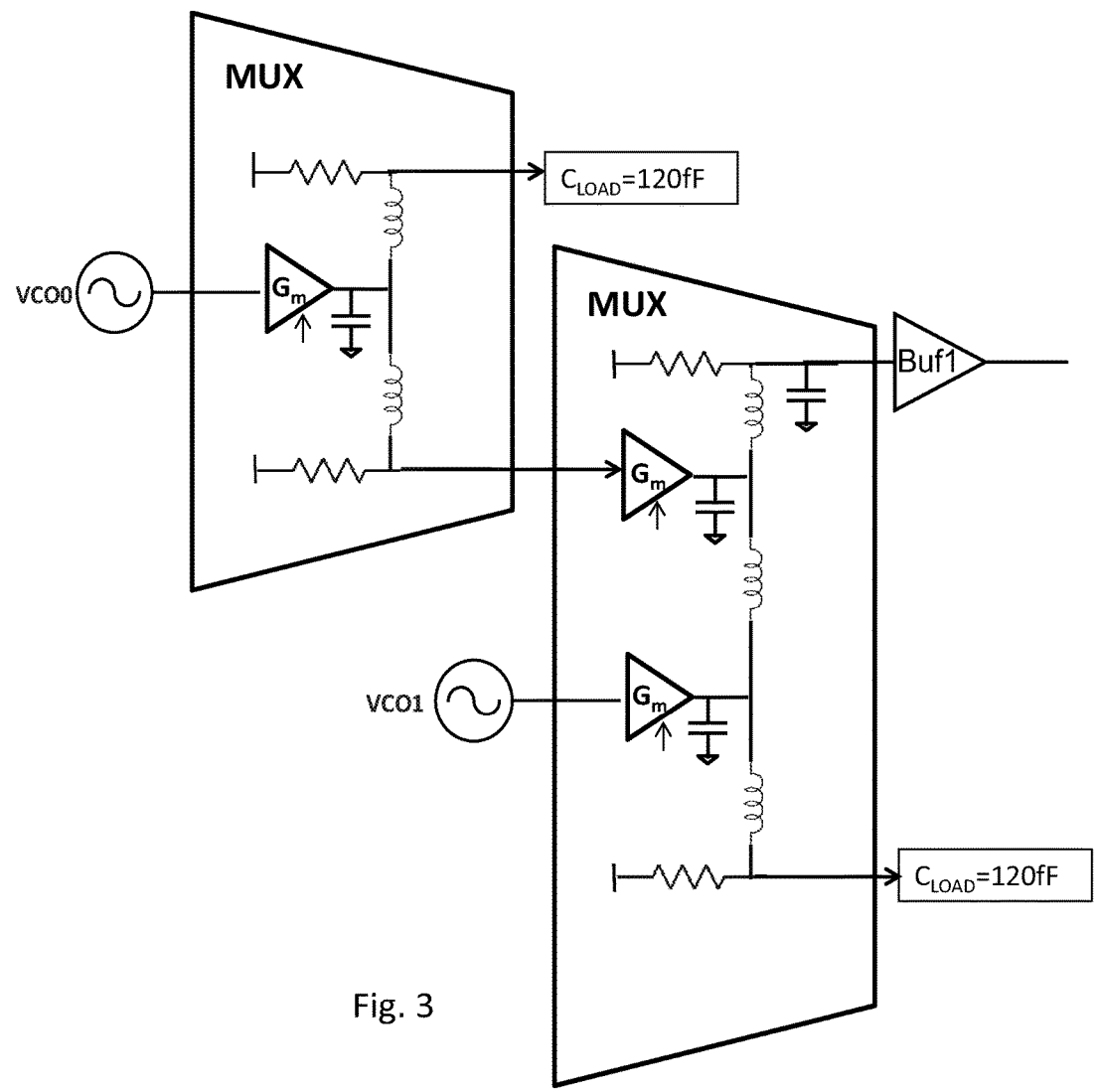
FIG. 3 shows an exemplary cascade of two oscillator multiplexers, in accordance with an example embodiment of the disclosure.

FIG. 3 shows example of using two oscillator multiplexers in series, in accordance with an example embodiment of the disclosure. In FIG. 3, the phase of VCO1 at Buf1 may stay aligned with the phase of VCO0 at Buf1 since the signal path from VCO1 to Buf1 is the same length as the signal path from VCO0 to Buf1. If an output of the multiplexer is not connected to a buffer, an equivalent capacitive load may be connected.

Figure 4:
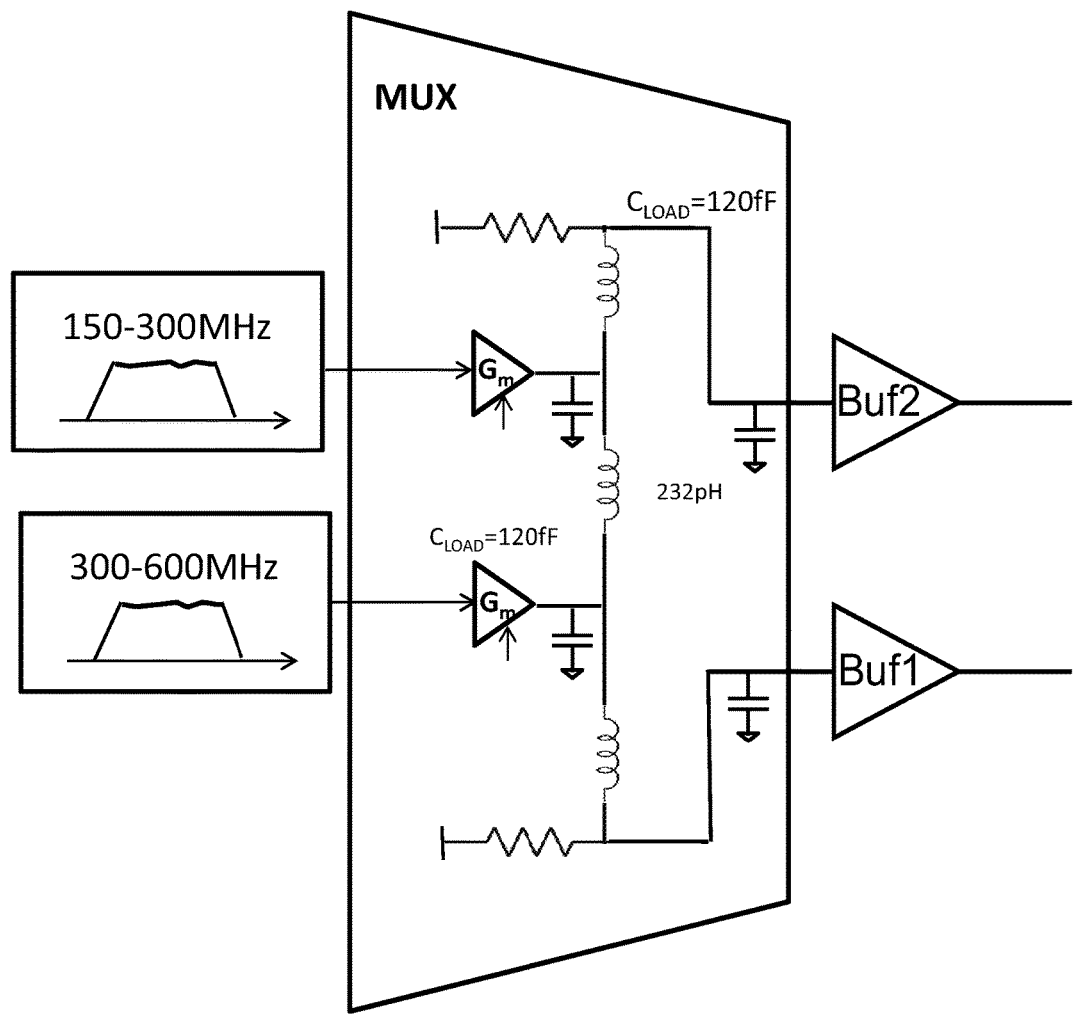
FIG. 4 shows an exemplary spectrum combiner with two inputs and two outputs, in accordance with an example embodiment of the disclosure.

FIG. 4 shows example of inputting a spectrum signal to a multiplexer, in accordance with an example embodiment of the disclosure. In FIG. 4, either the driver to the 150-300 MHz signal or the driver to the 300-600 MHz signal may be enabled, thereby providing either the 150-300 MHz signal or the 300-600 MHz signal at Buf1 and Buf2. Alternatively in FIG. 4, the driver to the 150-300 MHz signal and the driver to the 300-600 MHz signal may be enabled, thereby providing a combined 150-600 MHz signal at Buf1 and Buf2. Also, note that aspects of FIG. 2 and FIG. 3 may be incorporated into FIG. 4. For example, as described regarding FIG. 2, more than two spectrum signals and/or tones may be combined or selected and more than two buffer outputs may be made available. For example, as described regarding FIG. 3, delay compensation may be achieved by cascading multiplexers and buffer outputs that are not required may be terminated.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip. Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system for high frequency signal selection, wherein the system comprises:

a first driver operable to receive a first high frequency input, wherein an output of the first driver is operably coupled, via a first inductive element, to a first resistive load and a first buffer, wherein the first high frequency input is transferred to the first buffer by enabling a current to the first driver, and wherein the first inductive element comprises a plurality of inductors, and wherein an input to a second buffer is coupled to two inductors of the plurality of inductors; and a second driver operable to receive a second high frequency input, wherein an output of the second driver is operably coupled, via a second inductive element, to the output of the first driver, wherein the second high frequency input is transferred to the first buffer by enabling a current to the second driver.

2. The system of claim 1, wherein the output of the second driver is operably coupled, via a third inductive element, to a second resistive load and a second buffer.

3. The system of claim 2, wherein the first high frequency input is transferred to the first buffer and the second buffer by enabling the current to the first driver.

4. The system of claim 1, wherein a resonance frequency of the system is on the order of tens of gigahertz.

5. The system of claim 1, wherein the first resistive load has a resistance on the order of tens of ohms.

6. The system of claim 1, wherein the first driver contributes a capacitance to the system.

7. The system of claim 1, wherein the first high frequency input comprises a band of frequencies.

8. The system of claim 1, wherein the first high frequency input is a voltage controlled oscillator frequency.

9. The system of claim 1, wherein a distance between an input of the first driver and an input of the second driver is less than one millimeter.

10. A method for high frequency signal selection, wherein the method comprises:

receiving a first high frequency input, by a first driver, wherein an output of the first driver is operably coupled, via a first inductive element, to a first resistive load and a first buffer, and wherein the first inductive element comprises a plurality of inductors, and wherein an input to a second buffer is coupled to two inductors of the plurality of inductors;

receiving a second high frequency input, by a second driver, wherein an output of the second driver is operably coupled, via a second inductive element, to the output of the first driver; and selectively enabling a current to one or both of the first driver and the second driver, thereby respectively transferring one or both of the first high frequency input and the second high frequency input to the first buffer.

11. The method of claim 10, wherein the output of the second driver is operably coupled, via a third inductive element, to a second resistive load and a second buffer.

12. The method of claim 11, wherein selectively enabling a current to one or both of the first driver and the second driver respectively transfers one or both of the first high frequency input and the second high frequency input to the first buffer and the second buffer.

13. The method of claim 10, wherein a resonance frequency of the method is on the order of tens of gigahertz.

14. The method of claim 10, wherein the first resistive load has a resistance on the order of tens of ohms.

15. The method of claim 10, wherein the first driver contributes a capacitance to the method.

16. The method of claim 10, wherein the first high frequency input comprises a band of frequencies.

17. The method of claim 10, wherein the first high frequency input is a voltage controlled oscillator frequency.

18. The method of claim 10, wherein a distance between an input of the first driver and an input of the second driver is less than one millimeter.

19. A system for high frequency signal selection, wherein the system comprises:
- a first driver operable to receive a first high frequency input, wherein an output of the first driver is operably coupled, via a first inductive element, to a first resistive load and a first buffer, wherein the first high frequency input is transferred to the first buffer by enabling a current to the first driver; and
- a second driver operable to receive a second high frequency input, wherein an output of the second driver is operably coupled, via a second inductive element, to the output of the first driver, wherein the second high frequency input is transferred to the first buffer by enabling a current to the second driver, and wherein the output of the second driver is operably coupled, via a third inductive element, to a second resistive load and a second buffer.

20. The system of claim 19, wherein the first high frequency input is transferred to the first buffer and the second buffer by enabling the current to the first driver.

21. The system of claim 19, wherein the first inductive element comprises a plurality of inductors and an input to a second buffer is coupled to two inductors of the plurality of inductors.

22. The system of claim 1, wherein a resonance frequency of the system is on the order of tens of gigahertz.

23. The system of claim 19, wherein the first resistive load has a resistance on the order of tens of ohms.

24. The system of claim 19, wherein the first driver contributes a capacitance to the system.

25. The system of claim 19, wherein the first high frequency input comprises a band of frequencies.

26. The system of claim 19, wherein the first high frequency input is a voltage controlled oscillator frequency.

27. The system of claim 19, wherein a distance between an input of the first driver and an input of the second driver is less than one millimeter.

28. A method for high frequency signal selection, wherein the method comprises:
- receiving a first high frequency input, by a first driver, wherein an output of the first driver is operably coupled, via a first inductive element, to a first resistive load and a first buffer;
- receiving a second high frequency input, by a second driver, wherein an output of the second driver is operably coupled, via a second inductive element, to the output of the first driver, and wherein the output of the second driver is operably coupled, via a third inductive element, to a second resistive load and a second buffer; and
- selectively enabling a current to one or both of the first driver and the second driver, thereby respectively transferring one or both of the first high frequency input and the second high frequency input to the first buffer.

29. The method of claim 28, wherein selectively enabling a current to one or both of the first driver and the second driver respectively transfers one or both of the first high frequency input and the second high frequency input to the first buffer and the second buffer.

30. The method of claim 28, wherein the first inductive element comprises a plurality of inductors and an input to a second buffer is coupled to two inductors of the plurality of inductors.

31. The method of claim 28, wherein a resonance frequency of the method is on the order of tens of gigahertz.

32. The method of claim 28, wherein the first resistive load has a resistance on the order of tens of ohms.

33. The method of claim 28, wherein the first driver contributes a capacitance to the method.

34. The method of claim 28, wherein the first high frequency input comprises a band of frequencies.

35. The method of claim 28, wherein the first high frequency input is a voltage controlled oscillator frequency.

36. The method of claim 28, wherein a distance between an input of the first driver and an input of the second driver is less than one millimeter.

* * * * *